Figure 1:
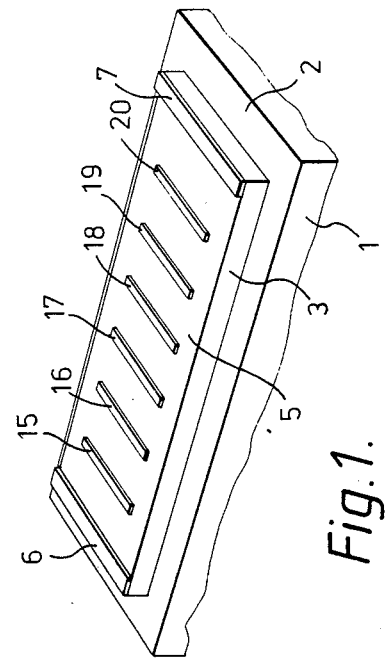

United States Patent [19]

Elliott et al.

[11] Patent Number: 4,931,648

[45] Date of Patent: Jun. 5, 1990

[54] THERMAL RADIATION IMAGING DEVICES AND SYSTEMS

[75] Inventors: Charles T. Elliott, Worcester; David E. Charlton, Southampton, both of Great Britain

[73] Assignee: Philips Electronic and Associated Industries Ltd., London, England

[21] Appl. No.: 267,611

[22] Filed: Jun. 2, 1981

[51] Int. Cl.[5] ............................................. G01J 5/22
[52] U.S. Cl. ............................. 250/370.10; 250/334; 250/332; 250/330; 250/211 J
[58] Field of Search ............... 250/370, 330, 332, 334, 250/211 J, 370.1

[56] References Cited

U.S. PATENT DOCUMENTS

| | | | |
|---|---|---|---|
| 3,317,733 | 5/1967 | Horton et al. | 250/211 J |
| 3,324,297 | 6/1967 | Stieltjes et al. | 250/211 J |
| 3,391,282 | 7/1968 | Kabell | 250/211 J |
| 3,704,376 | 11/1972 | Lehovec | 250/211 J |
| 3,961,998 | 6/1976 | Schargnhorst et al. | 250/211 J |
| 3,983,573 | 9/1976 | Ishihara | 357/30 |
| 3,995,159 | 11/1976 | Elliott | 250/370 |
| 4,032,903 | 6/1977 | Weimer | 357/24 |
| 4,035,197 | 7/1977 | Raychaudhuri | 250/211 J |
| 4,238,674 | 12/1980 | Kuerbitz | 250/334 |

Primary Examiner—Stephen C. Buczinski
Attorney, Agent, or Firm—Cushman, Darby & Cushman

[57] ABSTRACT

Between the spaced biasing electrodes of a thermal radiation imaging device A D.C. bias source is connected to cause the flow of a bias current in the device body which is preferably of n-type cadmium mercury telluride. The bias current supports an ambipolar drift of radiation-generated minority carriers (holes) in the opposite direction. The device is operated in a system in which the radiation pattern is scanned across the device body in the same direction and at the same rate as the ambipolar velocity. Instead of having a single read-out electrode, a more sophisticated system with better performance is obtained by distributing between the spaced biasing electrodes a plurality of read-out electrodes each of which forms a Schottky barrier or p-n junction with the body material.

9 Claims, 3 Drawing Sheets

THERMAL RADIATION IMAGING DEVICES AND SYSTEMS

This Invention relates to thermal radiation imaging devices and to thermal radiation imaging systems.

Thermal imaging systems are used to convert a focussed radiation image, principally in the infra-red spectral region, of the temperature and thermal emissivity differences within a given scene into a visible picture. Hitherto it has been common practice to employ systems in which the image is scanned region by region over one or more detector elements which transform the infra-red radiation into an electrical signal. When using a plurality of detector elements these are commonly arranged as a linear array and the scanning may be either such that each element samples a separate part of the same image, a so-called 'parallel scan' mode, or each region of the image is focussed onto each element in turn, a so-called 'serial scan' mode. In both systems the provision of a linear array of elements means that each element has to be individually contacted. For large arrays this gives rise to considerable technological problems in manufacture, not only of the elements but also in their encapsulation, particularly as many of the detector devices are constructed for operation at low temperature, for example 77° K., and have to be mounted in a vacuum-tight enclosure with the leads to the individual elements passing through the enclosure in order to connect to the external circuitry which is not normally cooled.

In U.S. Pat. No. 3,995,159 issued on November 30th 1976, and the corresponding United Kingdom Patent Specification No. 1,488,258 published on October 12th 1977, the contents of each of which are hereby incorporated by reference, there is described a scanned image thermal detection system which enables some of the disadvantages associated with the use of prior art serial scan or parallel scan systems employing linear arrays of detector elements to be avoided and furthermore enables the possibility of obtaining some increased performance over existing systems. The system described employs a single filamentary element of infra-red sensitive semiconductor material in which free charge carriers can be generated on absorption of radiation within a certain wavelength range. Spaced ohmic contacts provided at opposite ends of the body enable a bias current to be produced in the longitudinal direction of the body and to support an ambipolar drift of radiation generated free minority charge carriers. Operation is based on the scanning of a radiation image along the surface of the body between the contacts in the same direction as and at a rate corresponding to the ambipolar drift velocity of the minority carriers. Read-out means are provided towards one end of the body either in the form of a pair of ohmic contacts or in the form of one rectifying junction contact and one ohmic contact. In the former case the picture signal is derived between the pair of ohmic contacts in accordance with the conductivity modulation that occurs in the region of the body between the pair of ohmic contacts due to the passage of photo-generated minority carriers through that region. When using one rectifying junction contact and one ohmic contact for the read-out the picture signal is derived from an output circuit including these contacts, the rectifying junction being either in a non-biased or in a reverse biased condition and thereby forming an extraction path for the minority carriers.

For successful operation of devices such as are described in the said United States and United Kingdom Patent Specifications it is a basic requirement that the active length of the body, that is the length of which the scanning of the image is effective in contributing to the output, and the situation of the read-out means is such that the photo-generated minority carriers in the ambipolar drift reach the read-out means in a time less than the average electron-hole recombination time of the semiconductor material. This places certain limitations on the active length of the body, the separation of read-out electrodes and the choice of semiconductor material. In respect of the material it is desired to have the property of a very long minority carrier lifetime and low surface recombination velocity. When using cadmium mercury telluride, n-type material is chosen on the basis that in such material the ratio of electron to hole mobility may be in the region of between 50 to 1 and 400 to 1.

The present invention is based on the recognition that when using plural diode read-out means it is possible to construct considerably more sophisticated systems and devices the operation of which is similar to that described in U.S. Pat. No. 3,995,159 and U.K. Patent Specification No. 1,488,258, said systems and devices enabling the obtainment of significant operational and performance advantages.

According to one aspect of the invention there is provided a thermal radiation imaging device comprising a semiconductor body of a given conductivity type in which free charge carriers can be generated on absorption of radiation within a certain wavelength range, spaced biasing electrode means on the body via which a bias current predominantly of majority charge carriers can be caused to flow in the body in a preferred direction and parallel to a major surface of the body, said bias current being capable of supporting an ambipolar drift of radiation generated free minority charge carriers in the opposite direction, the device being constructed for operation wherein a radiation pattern is scanned across a major surface of the semiconductor body in the same direction as the ambipolar drift and at a rate corresponding substantially to the ambipolar drift velocity, a plurality of read-out electrodes each comprising rectifying barrier forming means with the body material of said given conductivity type, said read-out electrodes being distributed in the ambipolar drift path between the biasing electrode means.

According to another aspect of the invention there is provided a thermal radiation imaging system comprising a semiconductor body of a given conductivity type in which free charge carriers can be generated on absorption of radiation within a certain wavelength range, spaced biasing electrode means on the body via which a bias current predominantly of majority charge carriers can be caused to flow in the body in a preferred direction and parallel to a major surface of the body, said bias current being capable of supporting an ambipolar drift of radiation generated free minority charge carriers in the opposite direction, a plurality of read-out electrodes each comprising rectifying barrier forming means with the body material of said given conductivity type, said read-out electrodes being distributed in the ambipolar drift path between the biasing electrode means, and means for scanning a thermal radiation pattern across said major surface of the semiconductor body in the same direction as the ambipolar drift and at a rate corresponding substantially to the ambipolar drift velocity.

In devices and systems in accordance with the invention the provision of plural read-out means each comprising a rectifying barrier enables considerable improvements to be made in terms of operational capabilities as will be described hereinafter with reference to various specific device forms. The basis for achieving such advantages is that when incorporating a rectifying barrier at the read-out electrode a signal derived from the output circuitry connected thereto can be representative of the instantaneous value of the minority carriers extracted by the rectifying barrier from the ambipolar drift in the vicinity of the rectifying barrier which in operation may be in a non-biased or reverse biased condition. The position of such a rectifying barrier with respect to the biasing electrode means is not critical provided the impedance of the rectifying barrier is large compared with the resistance of the body portion between the rectifying barrier and an electrode connection on the body which is maintained at a reference potential, for example one of the biasing electrodes. However the length of a portion of the semiconductor body surface preceding the rectifying barrier and over which total integration of the free minority charge carriers generated in said portion by scanning an image over said portion in the longitudinal direction thereof can be effected is limited to an effective distance $L_{eff}$ from the rectifying barrier where $$L_{eff} = \tau E \mu_a$$

where $\sigma$ is the lifetime of minority carriers in the semiconductor material, E is the electric field, and $\mu_a$ is the ambipolar mobility pertaining to the semiconductor material.

This usually approximates to the minority carrier mobility. This has to be taken into account in the positioning of the read-out electrodes in the various different forms of the device as will be described hereinafter.

In a device in accordance with the invention said read-out electrodes may each comprise a surface-adjoining region having opposite conductivity type properties whereby in operation radiation generated free charge carriers present in the ambipolar drift path in the proximity of said surface-adjoining region can be extracted via the rectifying barrier formed between said surface-adjoining region and the body material of said given conductivity type. Thus, for example when using a body of n-type cadmium mercury telluride, the said read-out electrodes may comprise a plurality of surface-adjoining regions having p-type properties.

In other forms of the device the rectifying barrier forming means may be different, for example the read-out electrodes may each comprise a metal layer on the semiconductor body and forming a Schottky barrier with the material of the semiconductor body.

Reference herein to a region having properties of a certain conductivity type is to be understood to mean that the region does not necessarily exhibit such properties at room temperature but does so at the intended temperature of operation of the device. Similarly reference to a semiconductor body being of a given conductivity type should be correspondingly interpreted. In the particular case of using n-type cadmium mercury telluride for the semiconductor body and when the intended temperature of operation of the device is 77° K. the presence of a rectifying barrier between the body and such a region forming part of a read-out electrode may not be apparent at room temperature.

In one specific form of a device in accordance with the invention a plurality of the read-out electrodes are provided at intervals in a line extending in the same direction as said ambipolar drift between the biasing means. This device may be referred to as a monolithic multiple linear array and in such a device there is produced in a single body the equivalent of a plurality of devices which are used sequentially. In this device a signal to noise advantage can be achieved corresponding to the signal to noise integration over substantially the whole length of the semiconductor body between the biasing electrode means and not merely a length $L_{eff}$.

In a monolithic multiple linear device of the said specific form the spacing in the direction of the said ambipolar drift of a succeeding read-out electrode from a preceding electrode may be chosen to be at most 3 times the mean distance over which the radiation generated free minority carriers can pass in a lifetime in the semiconductor material and preferably may be chosen to be of the order of the distance $L_{eff}$ over which integration of most of the radiation generated free minority charge carriers during passage of a radiation image over the surface can occur without recombination. In this manner signal integration can be effected over the majority of the length of the filament. However the particular distance of a succeeding read-out electrode from a preceding electrode will be chosen in accordance with the properties of the material of the semiconductor body, particularly the wavelength range to which the material is sensitive. This is because it is desired to avoid a blurring of the image due to the outward spread that occurs of a packet of radiation generated free minority carriers as said packet moves towards the read-out electrode. Therefore in materials in which the minority carriers have a longer lifetime and therefore a longer diffusion length the effects of diffusive blurring may more readily occur. It is when using these materials, and for example materials in which the absorption edge is in the 3–5 micron window, that it may be appropriate to make the distance between a preceding electrode and a succeeding read-out electrode significantly less than the maximum integration length $L_{eff}$ and less than the mean distance over which the radiation generated free minority charge carriers can pass in a lifetime in the material.

The operation of a monolithic multiple linear device as described may be in a manner similar to that described in the said United States Patent Specification and the said United Kingdom Patent Specification, the output signals derived from the succeeding read-out electrodes being fed for example to a tapped delay line, or to some form of time delay and integration circuit.

In another form the output signals derived from the read-out electrodes are supplied to directly driven display elements.

In other forms of a device in accordance with the invention, with respect to the surface area between the biasing electrode means the read-out electrodes are distributed in a direction normal to the direction of the ambipolar drift. Such an arrangement may be referred to generally as a monolithic parallel arrangement. In this manner, for example, scanning of a plurality of lines of a radiation pattern may be effected simultaneously, each line of the pattern having an associated elemental body portion with which a read-out electrode is correspondingly associated. Depending upon the particular application the read-out electrodes can be arranged, for example, in at least one line extending in a direction normal to the direction of the ambipolar drift, or in a more complex distribution.

In one particular form the read-out electrodes are arranged in two lines each extending in a direction normal to the direction of the ambipolar drift, and in said direction the electrodes in one line being in staggered relationship with respect to the electrodes in the other line. In this form the two-dimensional arrangement of the read-out electrodes may correspond to the lay-out of display elements in a matrix display connected to the imaging device, each display element being energised in accordance with the signal representative of integrated minority charge carriers derived from the correspondingly situated and connected electrode on the semiconductor body of the imaging device. Such a matrix display may be viewed with an optical system giving a one to one correspondence to the image scan, for example when using a system of prisms. With the preferred staggered situation of the read-out electrodes a full scan of the image space may be obtained without dead spaces between lines.

Other arrangements combining the properties of the multiple linear array and the monolithic parallel arrangement may be chosen in accordance with the desired application.

Thus with respect to the surface area between the biasing electrode means over which the ambipolar drift can be produced the read-out electrodes may be distributed in a direction parallel to the direction of the ambipolar drift and in a direction normal to the direction of the ambipolar drift, for example the read-out electrodes may be distributed in a regular array.

Such two dimensional arrays allow a combination of serial scan and parallel scan to be carried out simultaneously. Such operation, commonly called 'block' scanned, is in practice the form most commonly used in infra-red thermal imaging.

As a further alternative the geometrical arrangement of the read-out electrodes may be chosen to match the geometrical arrangement of correspondingly connected specific matrix display elements as desired.

Figure 2:
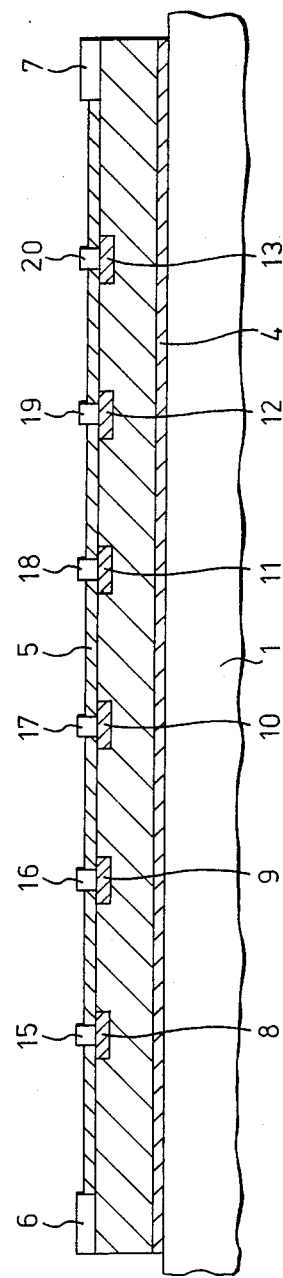
Figure 3:
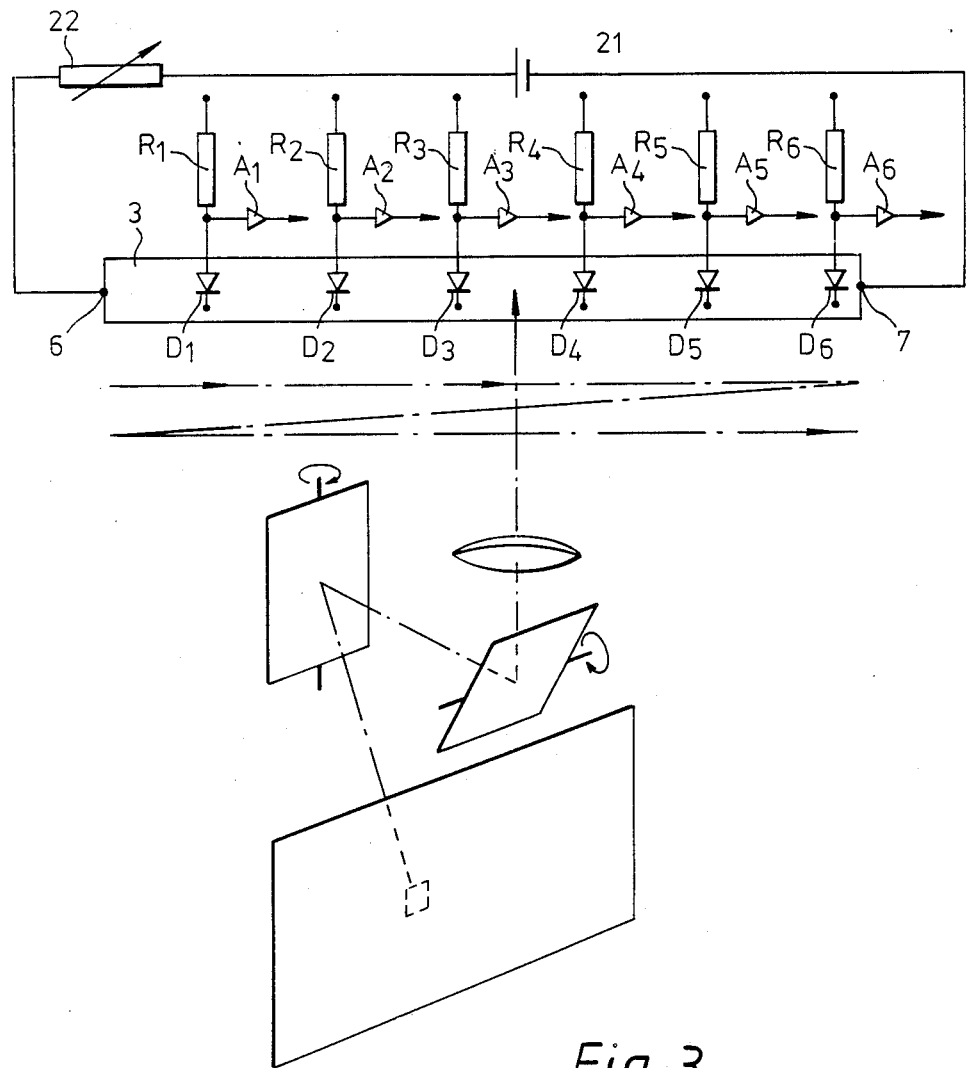
Figure 4:
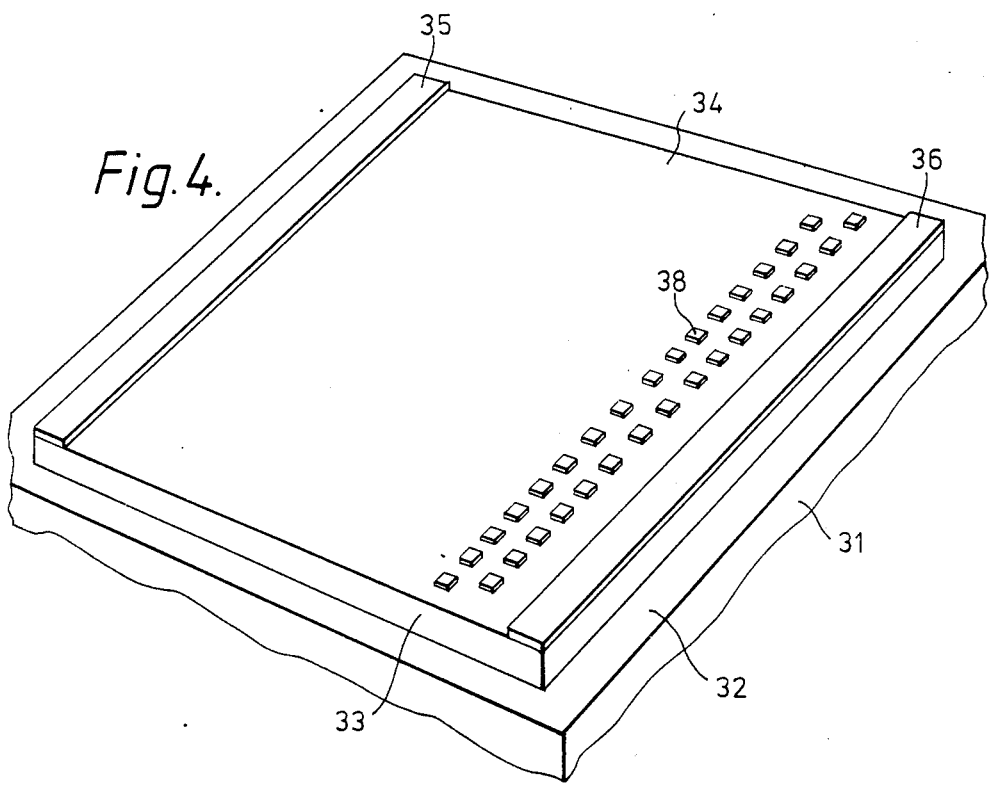
Figure 5:
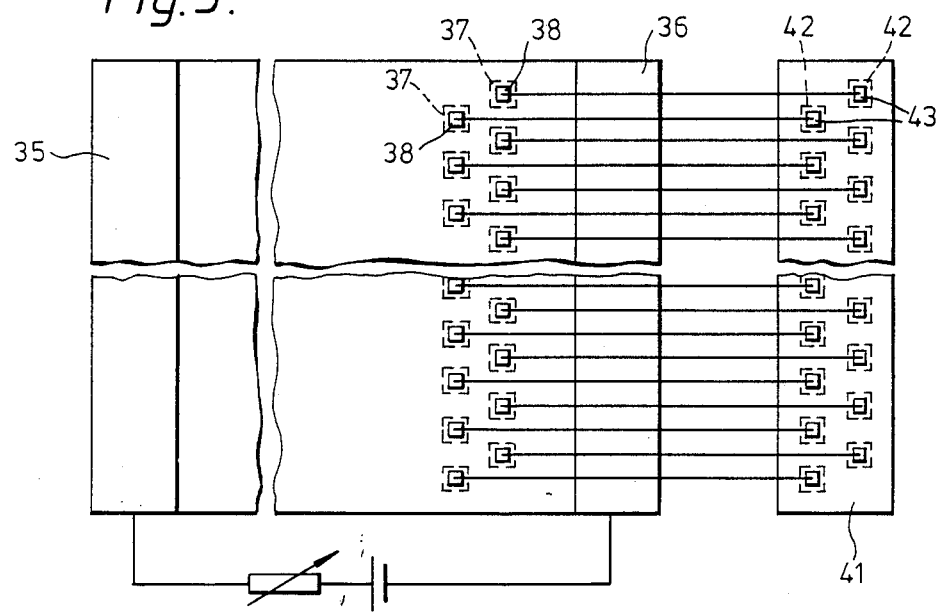

Embodiments of the invention will now be described, by way of example, with reference to the accompanying diagrammatic drawings, in which:

FIG. 1 is a perspective view of the semiconductor body and applied layers of a thermal radiation imaging device in accordance with the invention and in the form of a monolithic multiple linear device, FIG. 2 is a longitudinal cross-section of the device shown in FIG. 1 and taken along the line II—II of FIG. 1, FIG. 3 is a diagrammatic representation of a thermal imaging system in accordance with the invention and including a thermal imaging device of the form as shown in FIGS. 1 and 2, FIG. 4 is a perspective view of the semiconductor body and applied layers of another thermal radiation imaging device in accordance with the invention and in the form of a monolithic parallel arrangement, and FIG. 5 is a plan view showing part of the device shown in FIG. 4 and additionally part of a display means which is connected to the thermal radiation imaging device.

Referring now to the embodiment as illustrated in FIGS. 1 to 3, the device comprises a sapphire substrate 1 of 0.5 mm. thickness and having a major surface 2 of 1 cm.×1 cm. On the surface 2 there is mounted a substantially rectangular semiconductor body 3 of 2.5 mm.×50 microns×10 microns thickness. The body 3, which is secured to the substrate surface 2 by a layer 4 of an epoxy adhesive of approximately 0.5 micron thickness, in this embodiment is of n-type mercury cadmium telluride $Hg_{0.79}Cd_{0.21}Te$ having a carrier concentration of less than $5\times10^{14}cm^{-3}$. In material of this composition the absorption edge at an operating temperature of 77° K. is at a wavelength of approximately 11.5 microns. In this material the absorption of infra-red radiation in the 8–14 micron window is effective in generating electron-hole pairs, the mobility of the holes at the intended temperature of operation of 77° K. being 600 $cm^2V^{-1}sec^{-1}$ and the lifetime being 2.5 microseconds. The electron mobility is approximately $2\times10^5 cm^2V^{-1}sec^{-1}$.

On the upper surface of the semiconductor body 3 there is a passivating layer 5 of approximately 0.1 micron thickness and consisting mainly of the oxides of mercury, cadmium and tellurium. At opposite ends of the upper surface of the rectangular body 3 there are biasing electrodes 6 and 7 consisting of deposited layers of gold of approximately 1 micron thickness each forming ohmic contact with the semiconductor body surface. The dimension of the electrodes 6 and 7 in the longitudinal direction of the body 3 is 100 microns.

Adjoining the surface 4 of the body there are six regions 8–13 inclusive each having p-type properties, these regions having been formed by the local conversion of surface-adjoining portions of the n-type body into material having p-type properties. Each region 8–13 inclusive has an area of approximately 30 microns×50 microns, the smaller dimension being in a direction parallel to the longitudinal direction of the body 3. The p-n junctions between the p-type regions 8–13 inclusive and the n-type body 3 each extend in the body 3 to a depth of approximately 2 microns from the upper surface. At their termination in the upper surface the said p-n junctions, in this embodiment are shown as being covered by the passivating layer 5 but, depending upon the nature of the passivation used and the surface recombination properties, in other embodiments it may be desired to remove a passivating layer at these areas when said passivating layer is formed by a process involving the oxidation of the mercury cadmium telluride. In the present embodiment there are openings in the passivating layer above the p-type regions 8–13 inclusive each opening being of 40 microns by 20 microns and containing metal layer contacts 15–20 inclusive each formed of gold of 0.5 micron thickness. The contacts 15–20 inclusive together with the respective p-type surface regions 8–13 inclusive form a series of read-out electrodes the pitch of which is 0.5 mm. The longitudinal distance between the centres of the read-out electrode 8,15 and the adjoining edge of the biasing electrode layer 6 is also 0.5 mm. Similarly the longitudinal distance between the centre of the read-out electrode 13, 20 and the adjoining edge of the biasing electrode layer 7 is also 0.5 mm.

For the sake of clarity of illustration the electrical connections to the biasing electrode layers 6 and 7 and the electrical connections to the read-out electrode layers 15–20 inclusive are not shown in FIG. 1 or FIG. 2. These connections may consist of gold wires soldered to the surfaces of the electrode layers or bonded in a conventional manner. The further mounting of the device shown in FIGS. 1 and 2 will be in accordance with the specific intended application, but this will normally consist of the mounting of the substrate 1 in an evacuated enclosure having a window for transmission of infra-red radiation in the 8-14 micron band and the enclosure being provided with means for maintaining the semiconductor body 3 at a temperature of 77° K. One such form of mounting consists of the Dewar-type encapsulation as commonly employed in the infra-red detector art.

The operation of the device shown in FIGS. 1 and 2 will now be described with reference to FIG. 3 which is a diagrammatic form of part of a thermal imaging system including a device of the form shown in FIGS. 1 and 2. The body 3 is shown in FIG. 3 as a longitudinal strip and the six read-out electrodes are shown as forming diodes $D_1$-$D_6$ at intermediate locations along the strip. In series with the diodes $D_1$-$D_6$ thus formed there are a plurality of resistors $R_1$-$R_6$ each of 10 k.ohms. These resistors which normally will be located outside the enclosure containing the thermal imaging device are connected to points of constant potential difference from the potential of the corresponding diode regions. Alternatively the connection may be such that there is a reverse voltage of approximately 50 millivolts across each p-n junction in the body 3. The output signal from each of the read-out electrodes is fed to an amplification stage, for example a field effect transistor forming part of a read-out means, and represented diagrammatically in FIG. 3 as $A_1$-$A_6$. These outputs may be connected to a time delay and integration (TDI) device formed, for example, in charge coupled device (CCD) technology. For a full description of the use of a CCD time delay and integration device which may be used in conjunction with the serial read-out from an array of serially arranged infra-red detector elements reference is invited to the review by A. F. Milton in Topics in "Applied Physics", Vol. 19, (Optical and Infra-red Detectors, Editor R. J. Keyes), pages 197-228, Springer-Verlag, 1977.

The n-type semiconductor body 3 is connected in series, via the biasing electrodes 6 and 7 with a D.C. bias source 21 and a variable resistor 22 such that a bias current predominantly of majority charge carriers, in this case electrons, can be caused to flow in the body in the longitudinal direction from the electrode 7 to the electrode 6, said bias current being capable of supporting an ambipolar drift of radiation generated free minority carriers, in this case holes, in the opposite direction. A suitable range of bias voltage between the electrodes 6 and 7 is from 5 volts to 15 volts. At a potential drop of 15 volts per cm. in the n-type material of the said composition the ambipolar mobility is approximately 400 $cm^2V^{-1}sec^{-1}$.

The operation of the monolithic multiple linear array device in so far as the scanning of a radiation pattern and the focussing of an image of an elemental part of the pattern on the semiconductor body 3 may be in a similar manner to that described in the said United States and United Kingdom Patent Specifications. FIG. 3 shows in a purely diagrammatic form the presence of means for scanning such a thermal radiation image across the upper surface of the semiconductor body 3 in the same direction as the ambipolar drift and at a rate corresponding substantially to the ambipolar drift velocity. These means comprise a pair of rotatable mirrors and a lens system. In operation image points subtending an area of approximately 50 microns×50 microns in the image plane are moved with a velocity lying in the range of 5,000 $cm.sec^{-1}$ to 20,000 $cm.sec^{-1}$ along the surface of the filament body 3.

In this manner as the image is scanned across the surface of the semiconductor body at a rate corresponding to the ambipolar drift velocity, integration occurs of the photo-generated minority carriers in each of the n-type regions of the body between the p-type regions 8-13. At a field at 50 V/cm this drift velocity is 20,000 $cm.sec^{-1}$. Due to the spacing of the p-type regions being 0.5 mm. whereas the effective length $L_{eff}$ over which total integration of free holes can occur without recombination is 0.4 mm, corresponding to a carrier lifetime of 2 microseconds, in any one pass of the image over the whole distance between the biasing electrodes 6 and 7, there are six separate integrating stages, each over a length approaching $L_{eff}$, compared with only a single integrating stage over a length corresponding to $L_{eff}$ in the prior art devices. This enables a considerable advantage to be achieved in terms of the signal to noise ratio.

On the above figures, the internally produced TDI leads to an increase in signal to noise of approximately 2.8 times for each set of read-out electrodes. The additional improvement in signal to noise of about 2.4 times due to the external TDI effected on signals from the six read-out diodes leads to a total improvement in signal to noise of about 7 times compared with a conventional photoconductive element.

Referring now to FIGS. 4 and 5, there will be described another embodiment of a thermal imaging device and also, with reference to FIG. 5, the employment of the device in a thermal imaging system.

The device shown in FIG. 4 comprises a sapphire substrate 31 of 0.5 mm thickness and having a major surface 32 of 0.5 cm×0.5 cm. On the surface 32 there is mounted a semiconductor body 33 of 1.5 mm×1.6 mm×10 microns thickness. The body 33, which is secured to the substrate surface 32 by a layer of an epoxy adhesive of approximately 0.5 microns thickness, is of the same basic material composition as the body 3 in the previously described embodiment, namely mercury cadmium telluride of composition $Hg_{0.79}Cd_{0.21}Te$.

On the upper surface of the semiconductor body 3 there is a passivating layer 34 of approximately 0.1 micron thickness and consisting mainly of the oxides of mercury, cadmium and tellurium. At opposite ends of the upper surface of the body 33 there are biasing electrodes 35 and 36 consisting of deposited layers of gold of approximately 1 micron thickness, each forming ohmic contact with the semiconductor body surface. The width of each of the electrodes 35 and 36 is 100 microns.

Adjoining the surface of the body 33 near the biasing electrode 36, there are thirty-two regions, each having p-type properties, these regions having been formed by local conversion of surface adjoining portions of the n-type body into material having p-type properties. The boundaries of the regions 37 are indicated by broken lines in FIG. 5. Each region 37 has an area of 50 microns×50 microns. The regions 37 are present in two parallel rows extending in a direction normal to the direction in which an ambipolar drift can be produced between the biasing electrodes 35 and 36. The regions 37 in the two rows are in a staggered arrangement, the pitch distances between adjoining regions in the same row being 100 microns and the pitch distances between adjoining regions in the different rows also being 100 microns. The p-n junctions between the p-type regions 37 and the n-type body 33 each extend in the body to a depth of approximately 2 microns from the upper surface. Above each of the p-type regions 37 there is an opening in the passivating layer, said openings being centrally disposed with respect to the surface area of the p-type regions and each having an area of 40 microns×40 microns. Each opening contains a metal layer contact 38 of gold of 0.5 micron thickness. The contacts 38 together with the respective p-type surface regions 37 form a series of thirty-two read-out electrodes arranged in two parallel rows. The longitudinal distance between the edge of the biasing electrode 36 and edges of the metal layers 38 of the read-out electrodes in the adjacently situated row is 50 microns.

For the sake of clarity of illustration the electrical connections to the biasing electrode layers 35 and 36 and the electrical connections to the read-out electrode metal layer contacts 38 are not shown in FIG. 4. As in the previous embodiment these connections may be formed by gold wires soldered to the surfaces of the electrode layers. The further mounting of the device may be in a similar manner as that described in the previous embodiment. In the present example, as illustrated in FIG. 5, the metal layer read-out electrodes 38 in series with the rectifying barriers formed between the p-type regions 37 and the n-type body 33 are directly connected to part of a display means. This display means comprises a monolithic array of thirty-two light emitting diodes formed in a semiconductor body 41. The light emitting diode junctions 42 are indicated in broken lines in FIG. 5 and the electrode layer contacts 43 thereto are shown in full lines. The thirty-two diode junctions are arranged in two parallel rows and in correspondence with the read-out electrodes 38 of the imaging device to which they are individually connected. Normally the body 41 will be located outside the enclosure containing the thermal imaging device.

The device shown in FIG. 4 may be employed in a parallel scan mode and with the staggered arrangement of the read-out electrodes in two rows pattern information in thirty-two lines can be recorded with no intermediate spacing between the lines. The range of bias voltage between the electrodes 35 and 36 may be between 2 and 10 volts, leading to fields between 13 and 65 V.sec$^{-1}$. The resultant ambipolar drift velocities lie between 4,000 and 40,000 cm.sec$^{-1}$.

In the system shown in FIG. 5 the pattern information in the form of electrical signals obtained via the drain of integrated minority charge carriers in the ambipolar drift at the p-n junctions associated with the read-out electrodes 37, 38 is transferred directly via the read-out electrodes to the correspondingly arranged and connected light emitting diodes 41, 42. The system further comprises optical means operating on a one to one correspondence with the image scan for building up the output of the light emitting diode into a picture form of display. The image may be produced conveniently viewing the light emitting diodes in the same mirror as that used to produce the image scan. Conventionally such use is obtained by silvering the reverse surface of the scanning mirror in order to observe the light emitting diodes.

As an alternative to the use of directly connected light emitting diodes, other read-out means may be connected to the metal layer electrodes 38, for example the multiple inputs of a charge coupled device.

It will be appreciated that many modifications are possible within the scope of the present invention, for example, as an alternative to providing the rectifying barriers within the bulk of the n-type body, they may be formed at the surface of the n-type body. One way of achieving such a structure is the deposition of p-type material on the n-type body. In another form the rectifying barriers are formed as Schottky junctions at the surface of the semiconductor body by metal layer parts having a suitable work function.

For the n-type body of mercury cadmium telluride, the composition may be differently chosen, for example when the device is for imaging radiation in the 3–5 micron band. When forming such a device in the multiple linear configuration of FIGS. 1 to 3, the pitch distance between the p-type regions may be significantly less than $L_{eff}$ in order to reduce the effects of diffusive spread and consequent blurring of the image signals obtained.

In the embodiments described the n-type bodies are formed as discrete bodies which are secured to an insulating substrate. In an alternative form the n-type body material is formed in an epitaxially deposited n-type layer, for example as deposited on an intrinsic substrate or a substrate of cadmium telluride.

Other means may be employed for deriving image information signals from the read-out electrodes associated with the rectifying barriers of the multiple linear device. Thus, one such means is a form of tapped delay line as described on page 216 of the review paper by A. F. Milton referred to herein.

In order to remove any unwanted injected minority carriers from the ambipolar drift path adjacent the main biasing electrode which forms the anode there may be provided an additional rectifying barrier adjacent said biasing electrode in order to provide a drain for such minority carriers and thereby effectively isolate the first stage of the ambipolar drift path from said biasing electrode.

What we claim is:

1. A thermal radiation imaging system comprising
   (a) a semiconductor body of a given conductivity type in which free charge carriers can be generated on absorption of radiation within a certain wavelength range,
   (b) spaced biasing electrode means on the body via which a bias current predominantly of majority charge carriers can be caused to flow in the body in a preferred direction and parallel to a major surface of the body, said bias current being capable of supporting an ambipolar drift of radiation-generated free minority charge carriers in the opposite direction to the flow of majority carriers,
   (c) means for scanning a radiation pattern across a major surface of the semiconductor body in the same direction as the ambipolar drift and at a rate corresponding substantially to the ambipolar drift velocity whereby integration of the minority charge carriers generated by the radiation pattern occurs with the ambipolar drift, and
   (d) plural read-out electrodes each comprising a rectifying barrier formed with the body material of said given conductivity type, which rectifying read-out electrodes are distributed in the ambipolar drift path between the biasing electrode means to detect the integrated radiation-generated minority charge-carriers in the ambipolar drift at different locations in the body.

2. A thermal radiation imaging system as claimed in claim 1, wherein said rectifying read-out electrodes each comprise a surface-adjoining region having opposite conductivity type properties whereby in operation radiation-generated free charge carriers present in the ambipolar drift path in the proximity of said surface-adjoining region can be extracted via the rectifying barrier formed between said body surface-adjoining region and the body material of said given conductivity type.

3. A thermal radiation imaging system comprising
(a) a semiconductor body of a given conductivity type in which free charge carriers can be generated on absorption of radiation within a certain wavelength range,
(b) spaced biasing electrode means on the body via which a bias current predominantly of majority charge carriers can be caused to flow in the body in a preferred direction and parallel to a major surface of the body, said bias current being capable of supporting an ambipolar drift of radiation-generated free minority charge carriers in the opposite direction to the flow of majority carriers,
(c) means for scanning a radiation pattern across a major surface of the semiconductor body in the same direction as the ambipolar drift and at a rate corresponding substantially to the ambipolar drift velocity whereby integration of the minority charge carriers generated by the radiation pattern occurs with the ambipolar drift, and
(d) plural read-out electrodes each comprising a rectifying barrier formed with the body material of said given conductivity type, which rectifying read-out electrodes are distributed in the ambipolar drift path between the biasing electrode means to detect the integrated radiation-generated minority charge-carriers in the ambipolar drift at different locations in the body, at least a plurality of the rectifying read-out electrodes being located at successive intervals in a line extending in the same direction as said ambipolar drift to provide a succession of integration and detection stages for the minority charge carriers generated by the radiation pattern.

4. A thermal radiation imaging system as claimed in claim 3, wherein the spacing in the direction of the ambipolar drift of a succeeding rectifying read-out electrode from a preceding rectifying read-out electrode is less than the mean distance over which the radiation generated free minority charge carriers can pass in a lifetime in the material.

5. A thermal radiation imaging system comprising
(a) a semiconductor body of a given conductivity type in which free charge carriers can be generated on absorption of radiation within a certain wavelength range,
(b) spaced biasing electrode means on the body via which a bias current predominantly of majority charge carriers can be cuased to flow in the body in a preferred direction and parallel to a major surface of the body, said bias current being capable of supporting an ambipolar drift of radiation-generated free minority charge carriers in the opposite direction to the flow of majority carriers,
(c) means for scanning a radiation pattern across a major surface of the semiconductor body in the same direction as the ambipolar drift and at a rate corresponding substantially to the ambipolar drift velocity whereby integration of the minority charge carriers generated by the radiation pattern occurs with the ambipolar drift, and
(d) plural read-out electrodes each comprising a rectifying barrier formed with the body material of said given conductivity type, which rectifying read-out electrodes are distributed in the ambipolar drift path between the biasing electrode means to detect the integrated radiation-generated minority charge-carriers in the ambipolar drift at different locations in the body,
and wherein, with respect to the surface area between the biasing electrode means over which the ambipolar drift can be produced, at least a plurality of the rectifying read-out electrodes are distributed in a direction normal to the direction of the ambipolar drift to detect the integrated radiation-generated minority charge carriers drifting in parallel in the semiconductor body.

6. A thermal radiation imaging system as claimed in claim 5, wherein the rectifying read-out electrodes are arranged in at least one line extending in a direction normal to the direction of the ambipolar drift.

7. A thermal radiation imaging system as claimed in claim 5, wherein with respect to the surface area between the biasing electrode means over which the ambipolar drift can be produced the rectifying read-out electrodes are distributed in a direction parallel to the direction of the ambipolar drift and in a direction normal to the direction of the ambipolar drift.

8. A thermal radiation imaging system as claimed in claim 7, wherein with respect to the surface area between the biasing electrode means over which the ambipolar drift can be produced the rectifying read-out electrodes are distributed in a regular array.

9. A thermal radiation imaging system as claimed in claim 7, including display means connected to an imaging device comprising the semiconductor body, said display means comprising a plurality of display elements individually energizable in accordance with output signals derived via the rectifying read-out electrodes of the imaging device and arranged in a corresponding pattern to said read-out electrode.

* * * * *